United States Patent [19]
Lee et al.

[11] Patent Number: 5,881,157
[45] Date of Patent: Mar. 9, 1999

[54] APPARATUS FOR COMPENSATING A FREQUENCY CHARACTERISTIC OF A REPRODUCTION AUDIO SIGNAL

[75] Inventors: Hai-wook Lee, Suwon, Rep. of Korea; Igor G. Vikulov, Ljuberzy, Russian Federation

[73] Assignee: Samsung Electronics Co., Ltd., Kyungki-Do, Rep. of Korea

[21] Appl. No.: 794,645

[22] Filed: Feb. 3, 1997

[30] Foreign Application Priority Data

Nov. 9, 1996 [KR] Rep. of Korea .................. 1996-53084

[51] Int. Cl.$^6$ ........................................ H03G 5/00
[52] U.S. Cl. ............................ 381/98; 381/61; 381/94.1; 381/94.8; 381/106
[58] Field of Search ............................... 381/98, 100, 102, 381/104, 106, 94.1, 94.4, 94.8, 94.9, 61

[56] References Cited

U.S. PATENT DOCUMENTS

| | | |
|---|---|---|
| 3,846,716 | 11/1974 | Dolby . |
| 4,208,548 | 6/1980 | Orban ........................................... 179/1 |
| 4,894,566 | 1/1990 | Rush ........................................ 307/542 |
| 5,018,205 | 5/1991 | Takagi et al. ............................... 381/98 |
| 5,168,526 | 12/1992 | Orban .......................................... 384/94 |
| 5,515,446 | 5/1996 | Velmer ....................................... 381/98 |

FOREIGN PATENT DOCUMENTS

| | | | |
|---|---|---|---|
| 1 393 152 | 1/1972 | United Kingdom ........... H04B 15/00 |
| 2 083 985 | 8/1981 | United Kingdom ............. H04B 1/10 |

*Primary Examiner*—Curtis A. Kuntz
*Assistant Examiner*—Duc Nguyen
*Attorney, Agent, or Firm*—Sughrue, Mion, Zinn, Macpeak & Seas, PLLC

[57] ABSTRACT

An apparatus for compensating a frequency characteristic of a reproduction audio signal removes noise from the reproduction signal in the high-frequency region during reproduction of the audio signal, and then emphasizes the noise-removed reproduction signal, thereby improving the frequency characteristic of the reproduction signal. The apparatus includes a high-pass filter for passing only a high-frequency component of the reproduction signal, a clipper for generating a clipped signal by cutting off a signal between predetermined levels from the high-pass filtered reproduction signal, and an adder for superposing the clipped signal on the reproduction signal to emphasize a high-frequency signal. The apparatus improves the frequency characteristic of a signal during reproduction and enhances a signal-to-noise (S/N) ratio by removing a noise component in the high-frequency region of the reproduction signal and controlling the level of the reproduction signal.

10 Claims, 2 Drawing Sheets

APPARATUS FOR COMPENSATING A FREQUENCY CHARACTERISTIC OF A REPRODUCTION AUDIO SIGNAL

BACKGROUND OF THE INVENTION

1. Field of the Invention

The present invention relates to an audio signal reproducing apparatus, and more particularly, to an apparatus for compensating a frequency characteristic of a reproduction audio signal by removing noise from the reproduction signal in a high-frequency region during reproduction of the audio signal and then emphasizing the noise-removed reproduction signal. The present application is based upon Korean Application No. 96-53084, which is incorporated herein by reference.

2. Description of the Related Art

FIG. 1 shows the relationship between the levels of a recording signal and a reproduction output signal. When the recording level exceeds a certain value, the linear relationship between the level of the recording signal and the reproduction output signal breaks down, causing the recording level to become saturated. That is, when the level of the recording signal is increased above a certain value, distortion is generated during reproduction. Also, since the level of the recording signal is proportional to the signal-to-noise (S/N) ratio, when the level of the recording signal is lowered, the S/N ratio is decreased.

FIG. 2 shows a frequency characteristic of an equalizer during recording. As can be seen from the graph, gain increases in proportion to frequency in a high-frequency region over a certain frequency during recording.

Thus, in a conventional method of recording an audio signal, the recording level is increased up to a level where the recording signal is not saturated so that the S/N ratio is increased without distortion of the signal.

In a conventional audio signal reproducing apparatus, even though the high-frequency component is emphasized in an equalizer during recording, the frequency characteristic in the high-frequency region is degraded during reproduction due to a structural problem between the tape and the head. Also, since the noise component included in a signal in the high-frequency region is relatively greater than in its low-frequency region, the S/N ratio is greatly degraded when the high-frequency component is compulsorily emphasized.

SUMMARY OF THE INVENTION

To solve the problem of the conventional apparatus, it is an object of the present invention to provide an apparatus for compensating a frequency characteristic of a reproduction audio signal and improving an S/N ratio by emphasizing a high-frequency reproduction signal while cutting off noise in a high-frequency region during reproduction of an audio signal.

To accomplish the above object, there is provided an apparatus for compensating a frequency characteristic of a reproduction audio signal comprising a high-pass filter for passing only a high-frequency component of the reproduction signal, a clipper for generating a clipped signal by cutting off a signal between predetermined levels from the high-pass filtered reproduction signal, and an adder for superposing the clipped signal on the reproduction signal to emphasize a high-frequency signal.

BRIEF DESCRIPTION OF THE DRAWINGS

The above object and advantage of the present invention will become more apparent by describing in detail a preferred embodiment thereof with reference to the attached drawings in which.

DETAILED DESCRIPTION OF THE INVENTION

Figure 1:
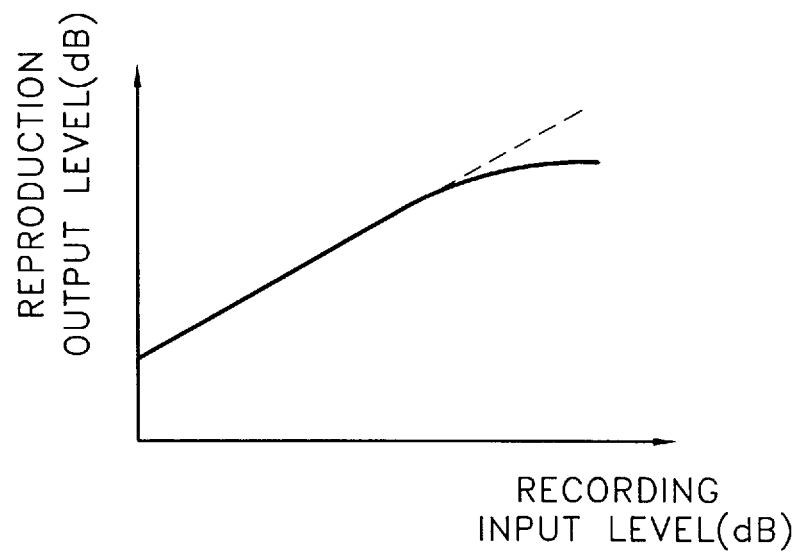
FIG. 1 is a graph showing a relationship between a recording input and a reproduction output.
Figure 2:
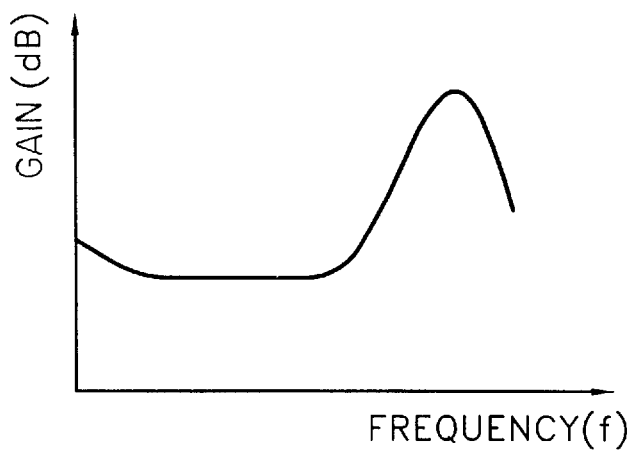
FIG. 2 is a graph showing a frequency characteristic of an equalizer during recording.
Figure 3:
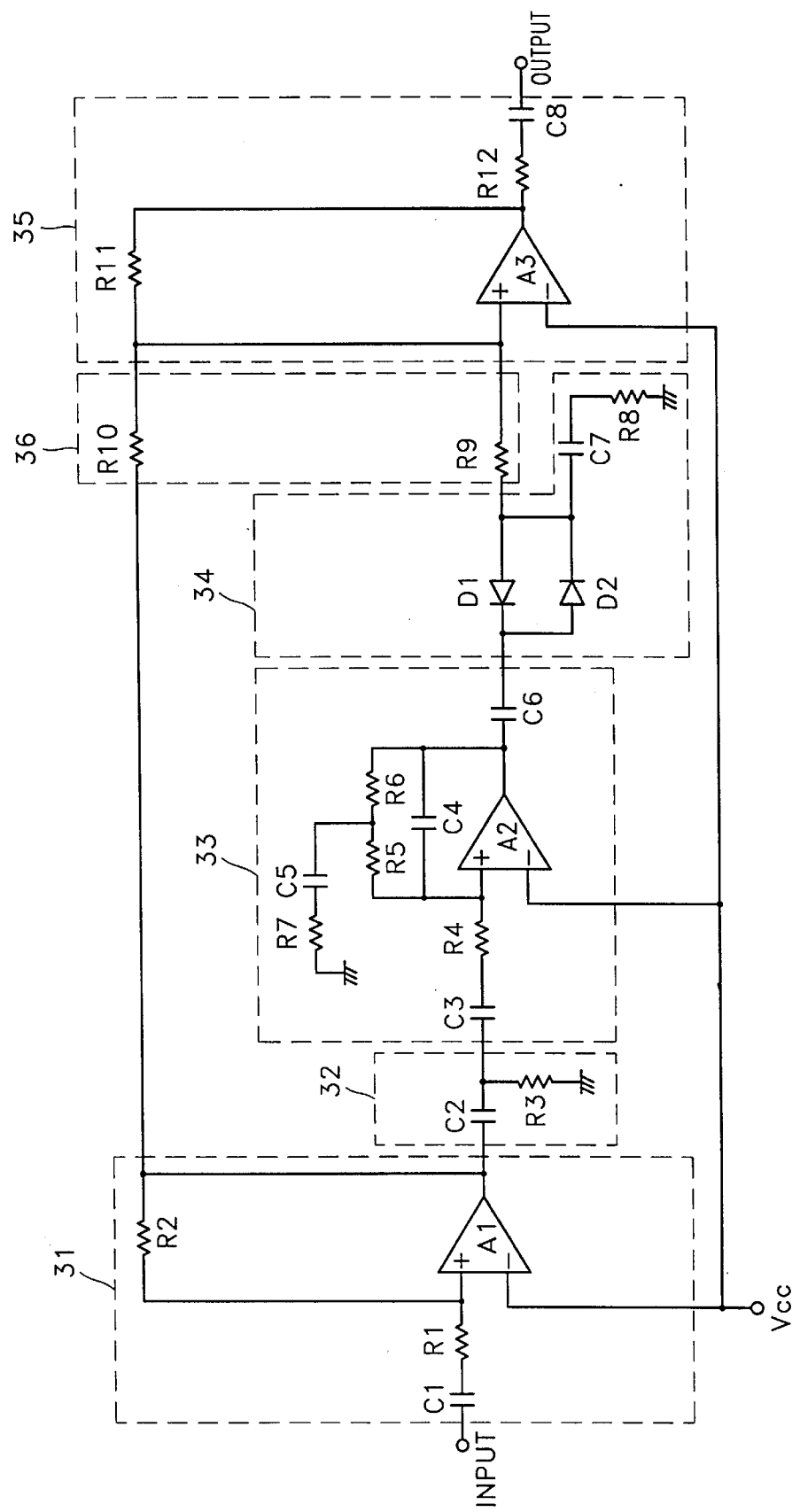
FIG. 3 is a circuit diagram of an apparatus for compensating a frequency characteristic of a reproduction audio signal according to the present invention.

FIG. 3 illustrates an apparatus for compensating a frequency characteristic of a reproduction audio signal according to the present invention. The apparatus includes a first amplifier 31 for amplifying a reproduction signal to a predetermined gain value, a high-pass filter 32 for passing only a high-frequency component of the firstly amplified signal, a second amplifier 33 for nonlinearly amplifying the high-pass filtered signal without a change in phase, a clipper 34 for cutting off a signal between predetermined levels of the secondly amplified signal, an adder 36 for superposing the signals output from the first amplifier 31 and the clipper 34, and a third amplifier 35 for amplifying the superposed signal to a predetermined gain value.

The first amplifier 31 is comprised of an operational amplifier A1, resistors R1 and R2 and a capacitor C1, and amplifies the level of the reproduction audio signal to a predetermined gain value, and then outputs the amplified reproduction audio signal.

The high-pass filter 32 is comprised of a capacitor C2 and a resistor R3, and receives the signal amplified by the first amplifier 31 and passes only the high-frequency signal while cutting off the middle- and low-frequency components. The high-pass filter 32 improves the frequency characteristic by compensating the high frequency region of the reproduction signal.

The second amplifier 33 is comprised of an operational amplifier A2, resistors R4 to R7 and capacitors C3 to C6. The second amplifier 33 has a nonlinear amplification characteristic in that the high-pass filtered reproduction signal is input and amplified without a shift in phase.

The clipper 34 is comprised of diodes D1 and D2, a resistor R8 and a capacitor C7. Clipper 34 receives the output signal of the second amplifier 33, cuts off a signal between predetermined levels, and outputs the clipped signal.

To be more specific, suppose that the voltage in the anode of the diode D1 of the clipper 34 is V1, when the voltage in the cathode of the diode D1 as the input port of the clipper 34 is between V1±0.6V, a signal input to the clipper 34 does not pass through the diodes D1 and D2 and is cut off. If the voltage V1 is set as 0V, the clipper 34 cuts off a signal component between −0.6V and 0.6V among the input signal. That is, since most of the noise included in the reproduction signal exists in its high-frequency region and is distributed in a lower level compared to the reproduction signal, this high-frequency noise is removed. Therefore, the clipper 34 cuts off the low-level noise included in the reproduction signal and having a high-frequency component and outputs a high-frequency reproduction signal. The clipper 34 compares the reproduction signal with a reference level and outputs only the high-frequency reproduction signal exceeding a predetermined level to the adder 36. That is, the low-level high-frequency noise component among the high-frequency reproduction signal is cut off, and the clipped signal is output to the adder 36.

The adder 36 is comprised of resistors R9 and R10, and superposes the output signal of the clipper 34 on the output signal of the first amplifier 31 through the respective resistors R9 and R10.

Thus, when the input reproduction signal having only middle- and low-band frequency components is cut off by the high-pass filter 32, the clipper 34 does not output any recording signal, and only the output signal of the first amplifier 31 is output from the adder 36. However, when the input reproduction signal has a high-frequency component, the clipper 34 outputs only a high-frequency reproduction signal having a size exceeding predetermined upper and lower levels centered on a predetermined reference level in order to remove noise included in the reproduction signal. Then, the output signal of the clipper 34 is superposed on the output signal of the first amplifier 31 amplifying the original reproduction signal, and the superposed signal is applied to the third amplifier 35.

The third amplifier 35 is comprised of an operational amplifier A3, resistors R11 and R12, and capacitor C8. The third amplifier 35 receives the output signal of the adder 36, amplifies the same to a predetermined gain, and outputs the amplified signal.

In the present invention operating as described above, when the reproduction signal after passing through an equalizer includes only the middle- and low-frequency signals, the level of the reproduction signal is not compensated. Also, when the reproduction signal includes only a high-frequency signal, only a high-frequency signal over a certain level based on a reference level is detected, and the detected high-frequency signal is then superposed on the original reproduction signal, thereby compensating the frequency characteristic in the high-frequency region.

As described above, the present invention improves the frequency characteristic of a signal during reproduction and enhances the S/N ratio by removing a noise component in the high-frequency region of a reproduction signal and controlling the level of the reproduction signal.

While the present invention has been described and illustrated with reference to a preferred embodiment thereof, it is to be readily understood that the present invention is not limited to the embodiment, and various changes and modifications can be made therein without departing from the spirit and scope of the invention defined in the appended claims.

What is claimed is:

1. An apparatus for compensating a frequency characteristic of a reproduction audio signal, comprising:

a high-pass filter for passing only a high-frequency component of the reproduction signal;

means for generating a modified signal by cutting off low level signals between predetermined threshold levels and outputting only that portion of said high-frequency component of the reproduction signal exceeding the predetermined threshold levels; and an adder for superposing said modified signal on said reproduction signal to emphasize a high-frequency signal.

2. The apparatus for compensating a frequency characteristic of a reproduction audio signal as claimed in claim 1, further comprising a nonlinear amplifier, connected between said high-pass filter and said means for generating, for amplifying said high-frequency component of the reproduction signal to a predetermined gain without a shift in phase.

3. The apparatus for compensating a frequency characteristic of a reproduction audio signal as claimed in claim 1, wherein said means for generating is comprised of at least two diodes.

4. The apparatus for compensating a frequency characteristic of a reproduction audio signal as claimed in claim 1, wherein said means for generating comprises:

a first diode whose cathode is connected to an input port and anode is connected to an output port of said means for generating;

a second diode whose anode is connected to said input port and cathode is connected to said output port in parallel with said first diode; and a capacitor and a resistor connected in series between said output port and ground.

5. The apparatus for compensating a frequency characteristic of a reproduction audio signal as claimed in claim 1, further comprising an initial amplifier for amplifying the reproduction signal to a predetermined gain value, and outputting the initially amplified reproduction signal to said high pass filter.

6. The apparatus for compensating a frequency characteristic of a reproduction audio signal as claimed in claim 1, further comprising a final amplifier for amplifying the superposed signal to a predetermined gain value.

7. A method for compensating a frequency characteristic of a reproduction audio signal, comprising the steps of:

high-pass filtering the reproduction signal so that only a high-frequency component is passed;

generating a modified signal by cutting off low level signals between predetermined threshold levels thresholds so as to leave only that portion of the high-frequency component of the reproduction signal which exceeds the threshold levels; and superposing said modified signal on said reproduction signal to emphasize a high-frequency signal.

8. The method for compensating a frequency characteristic of a reproduction audio signal as claimed in claim 7, further comprising the step of amplifying the high-pass filtered reproduction signal to a predetermined gain without a shift in phase.

9. The method for compensating a frequency characteristic of a reproduction audio signal as claimed in claim 7, further comprising the steps of amplifying, prior to high-pass filtering, the reproduction signal to a predetermined gain value.

10. The method for compensating a frequency characteristic of a reproduction audio signal as claimed in claim 7, further comprising the step of amplifying the superposed signal to a predetermined gain value.

* * * * *